US008752269B2

(12) United States Patent  
Chin et al.

(10) Patent No.: US 8,752,269 B2  
(45) Date of Patent: Jun. 17, 2014

(54) SYSTEM AND METHOD FOR CONNECTING AN AUTOMATION CONTROLLER AND A PROGRAMMABLE MODULE

(75) Inventors: Karen Chin, Singapore (SG); Melvin Wong, Singapore (SG); Soon Seng Kang, Singapore (SG)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 303 days.

(21) Appl. No.: 13/281,180

(22) Filed: Oct. 25, 2011

(65) Prior Publication Data

US 2012/0102715 A1    May 3, 2012

(30) Foreign Application Priority Data

Oct. 29, 2010   (SG) ................................ 201007988-7

(51) Int. Cl.  
B23P 11/00        (2006.01)  
H05K 5/00        (2006.01)  
H05K 7/00        (2006.01)

(52) U.S. Cl.  
USPC ........ 29/525.01; 361/732; 361/747; 361/728; 361/729; 29/525.02; 29/525.03

(58) Field of Classification Search  
USPC ............... 29/525.01, 525.02, 525.03; 403/27, 403/302, 306, 387, 408.1, 409.1; 411/166, 411/500, 548, 549; 312/219, 221, 111, 312/107.5; 361/728, 729, 732, 747  
See application file for complete search history.

(56) References Cited

U.S. PATENT DOCUMENTS

| | | | | |
|---|---|---|---|---|
| 3,351,817 A | * | 11/1967 | Wadolny et al. | 361/728 |
| 4,827,609 A | * | 5/1989 | Kawecki | 29/832 |
| 5,346,349 A | * | 9/1994 | Giovannetti | 411/549 |
| 5,600,542 A | * | 2/1997 | Malgouires | 361/732 |
| 5,690,445 A | * | 11/1997 | Wu | 403/306 |
| 6,134,115 A | * | 10/2000 | Sim et al. | 361/747 |
| 7,413,367 B2 | * | 8/2008 | Hawang | 403/297 |
| 8,149,582 B2 | * | 4/2012 | Carlson et al. | 361/731 |
| 8,199,513 B2 | * | 6/2012 | Benedetto et al. | 361/747 |
| 2008/0089742 A1 | * | 4/2008 | Hawang | 403/408.1 |

FOREIGN PATENT DOCUMENTS

JP    2006046066 A  *  2/2006 ............. E05B 65/00

* cited by examiner

Primary Examiner — Essama Omgba  
(74) Attorney, Agent, or Firm — Fletcher Yoder, P.C.

(57) ABSTRACT

An interlocking system for connecting a programmable module and an automation controller of an industrial control and automation system is provided. The interlocking system includes a key comprising a shaft with a head and a first attachment feature. The interlocking system also includes a first keyhole in a programmable module cover. The first keyhole is configured to enable the head to pass upwardly there through. The interlocking system also includes a second keyhole in an automation controller cover. The second keyhole is configured to enable the first attachment feature to slide downwardly there through such that disengagement of the key from the second keyhole is resisted. The interlocking system also includes a second attachment feature on a lower surface of the automation controller cover. The second attachment feature is configured to engage with the first attachment feature when the first attachment feature is rotated about an axis of the shaft.

20 Claims, 12 Drawing Sheets

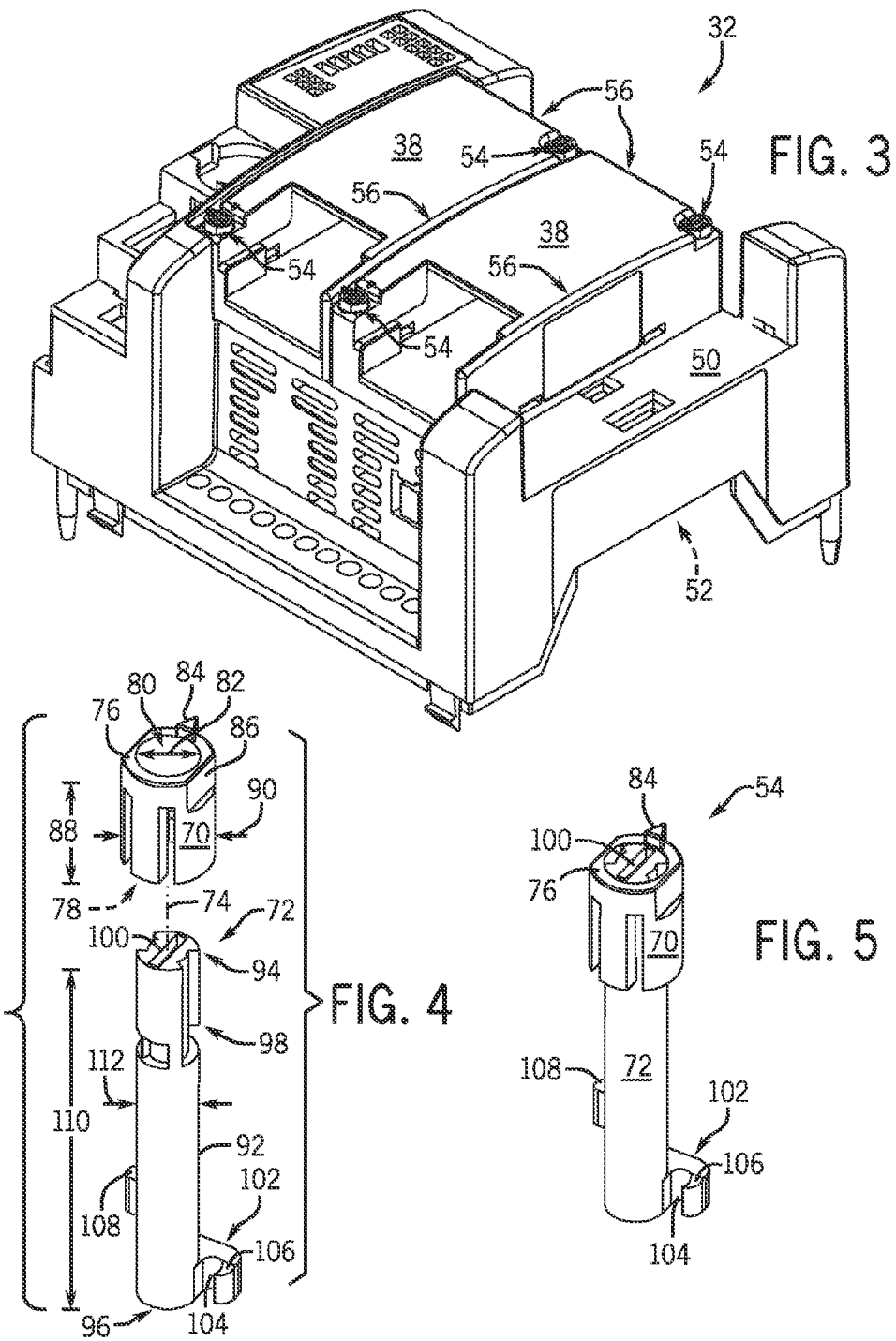

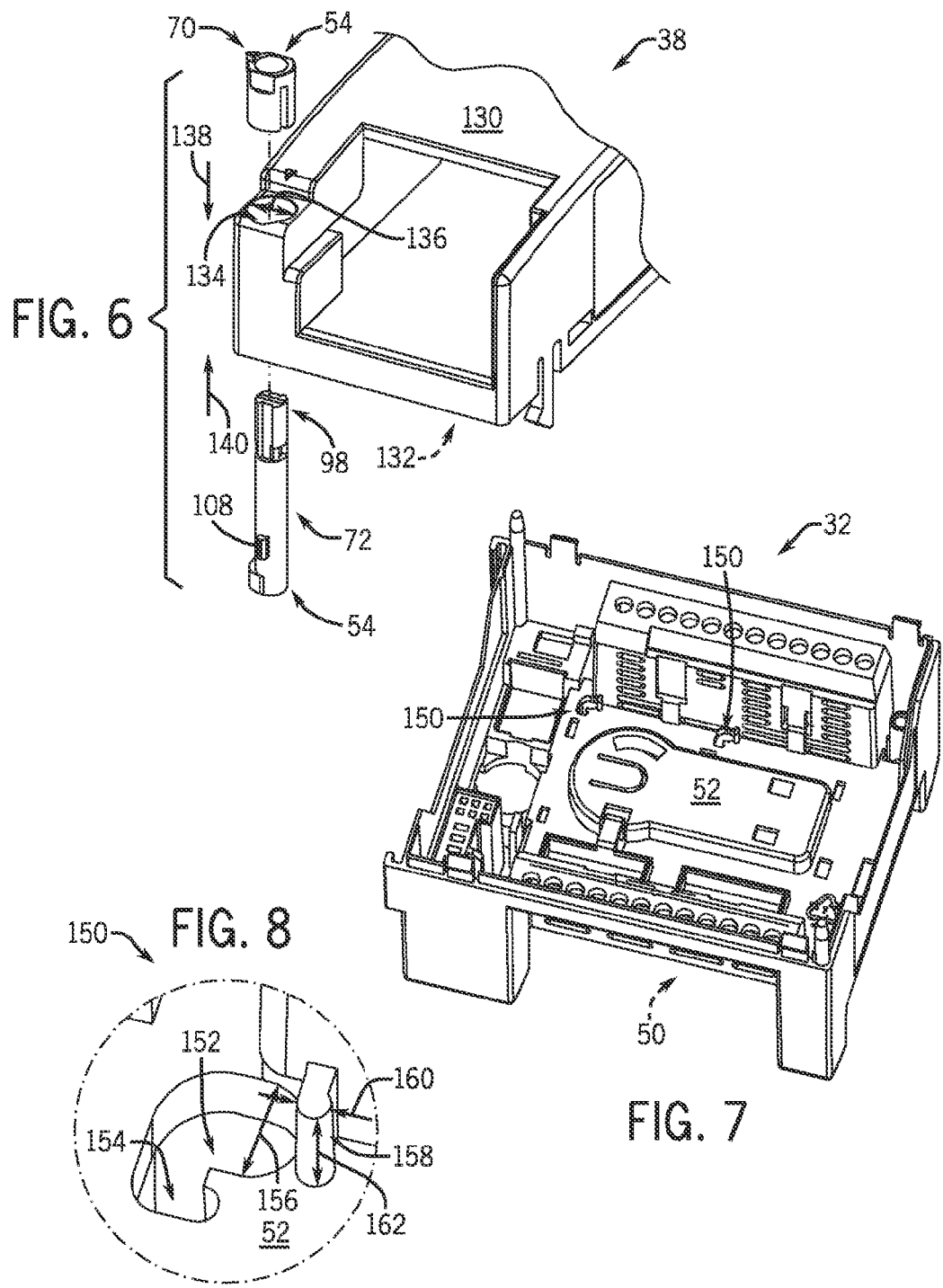

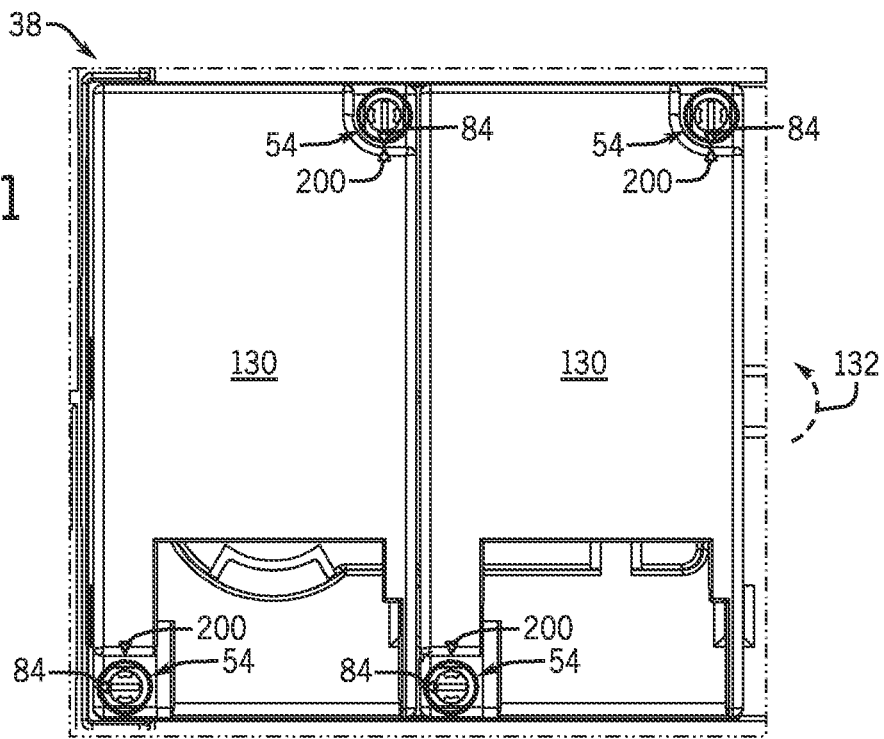
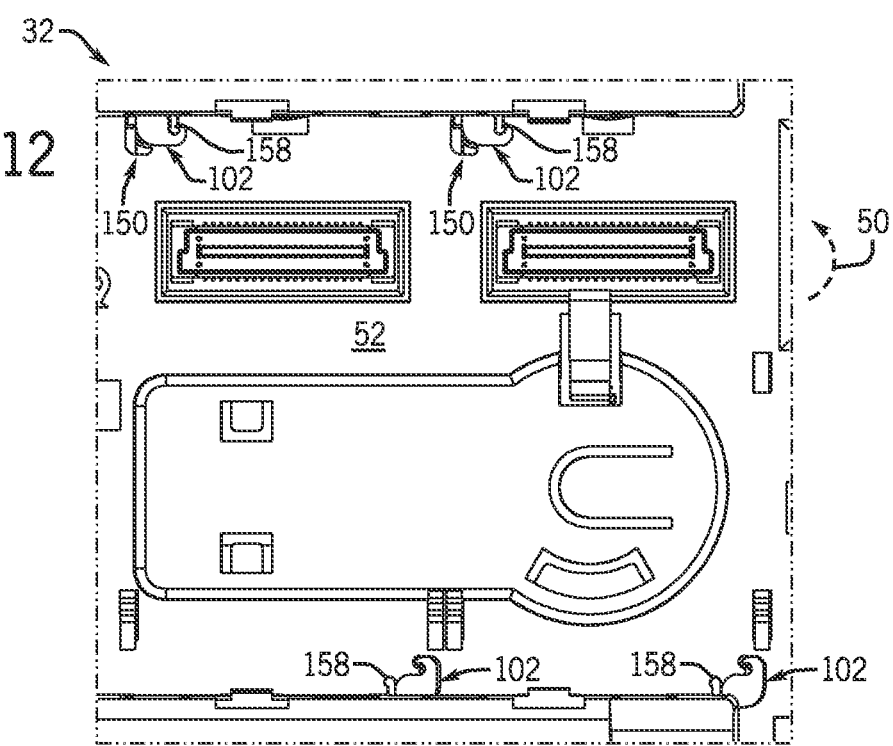

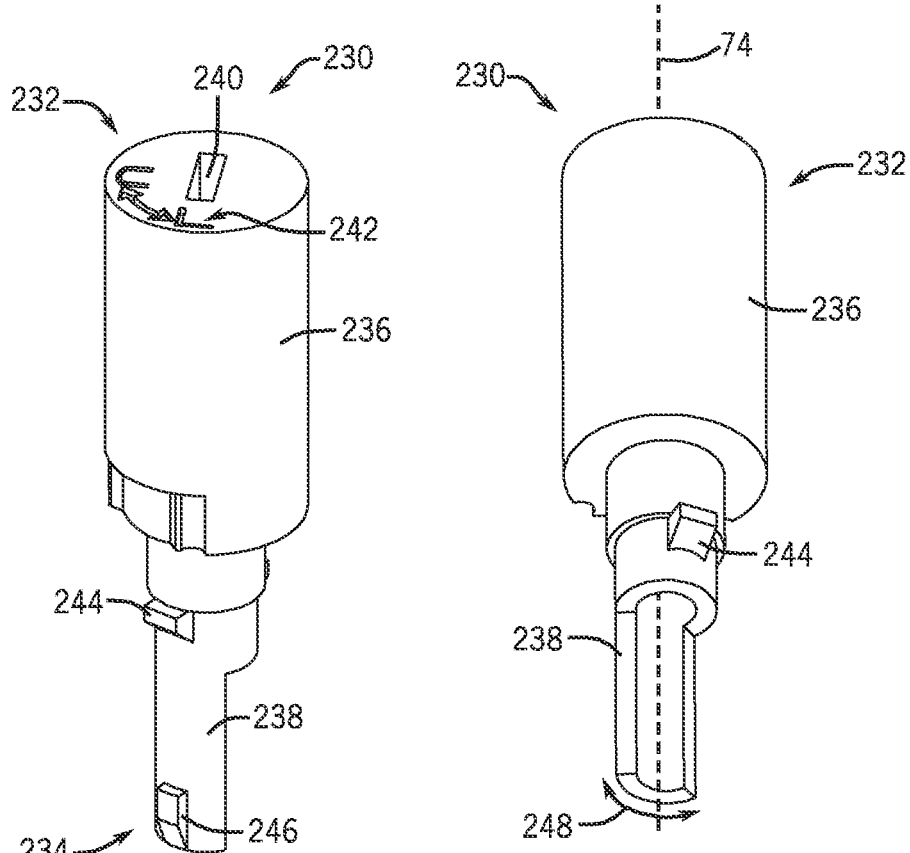
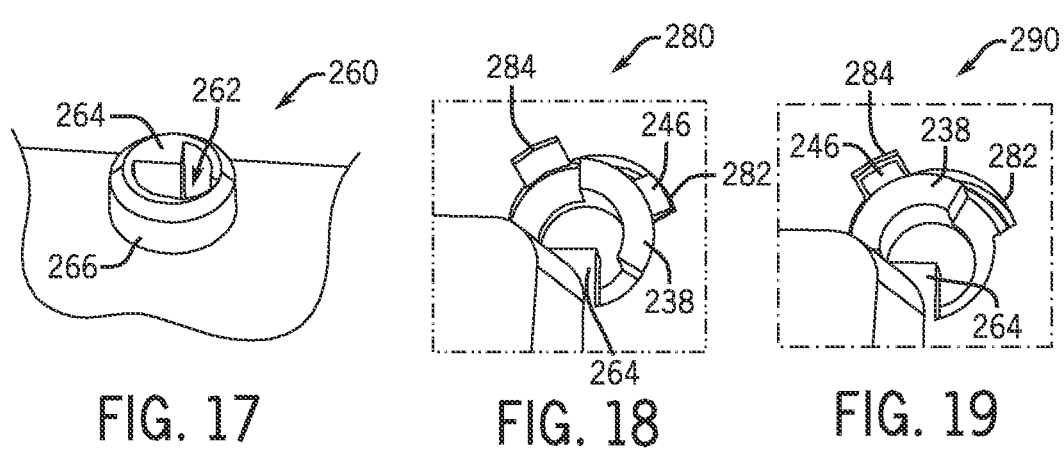

SYSTEM AND METHOD FOR CONNECTING AN AUTOMATION CONTROLLER AND A PROGRAMMABLE MODULE

CROSS REFERENCE TO RELATED APPLICATIONS

This application claims priority from and the benefit of Singapore Application No. 201007988-7, filed on Oct. 29, 2010 entitled "System and Method for Connecting an Automation Controller and a Programmable Module", which is herein incorporated by reference.

BACKGROUND

The invention relates generally to industrial automation and control systems, such as those used in industrial and commercial settings. More particularly, embodiments of the present invention relate to techniques for interlocking programmable modules with automation controllers of such systems.

Industrial automation and control systems are used for controlling factory automation and the like. Such systems include various components, such as programmable logic controllers (PLCs), semiconductor power electronic circuits, power supplies, motor starters, relays, and so forth, that are utilized to monitor and control a process or system. Typically, the PLC examines a series of inputs reflecting the status of a controlled process and changes outputs affecting control of the controlled process.

In traditional automation and control systems, various components of the system are interconnected together as modules. Certain components cooperate with other components to expand functionality. For example, industrial automation controllers may provide for connection of additional input/output (I/O) modules to add input and output functionality to such controllers. Indeed, adding an I/O module may allow a particular controller to interface with a specific type of control equipment. In such systems, the components or modules are connected using interlocking systems that utilize numerous mechanical parts for locking the modules together. It is now recognized that the mechanical parts of such interlocking systems can be cumbersome, delicate, and expensive. Furthermore, it is now recognized that the complex nature of such systems typically creates inefficiencies during assembly of components. In addition, such systems may not remain connected in response to vibration, shock, or similar forces. Accordingly, it is now recognized that it is desirable to develop an interlocking system for securing modules that provides a rigid connection between the modules while facilitating assembly.

BRIEF DESCRIPTION

In one embodiment, an interlocking system for connecting a programmable module and an automation controller of an industrial control and automation system is provided. The interlocking system includes a key comprising a shaft with a head on a first distal end of the shaft and a first attachment feature cantilevered from a second distal end of the shaft. The interlocking system also includes a first keyhole in a cover of the programmable module. The first keyhole is configured to enable the head to pass upwardly there through. The interlocking system also includes a second keyhole in a cover of the automation controller. The second keyhole is configured to enable the first attachment feature to slide downwardly there through such that axial rotation of the shaft causes the first attachment feature to become misaligned with the second keyhole and abut a lower surface of the cover of the automation controller such that disengagement of the key from the second keyhole is resisted. The interlocking system also includes a second attachment feature on a lower surface of the cover of the automation controller. The second attachment feature is configured to engage with the first attachment feature when the first attachment feature is rotated about an axis of the shaft and the engagement between the first and second attachment features maintains the first attachment feature in misalignment with the second keyhole.

In another embodiment, an industrial automation and control system includes a plurality of monitoring and/or control modules configured to perform a monitoring and/or control function, and an interlocking system configured to connect adjacent monitoring and/or control modules. The interlocking system includes a key comprising a shaft with a head on a first distal end of the shaft and a first attachment feature cantilevered from a second distal end of the shaft, and a first keyhole in a first module. The first keyhole is configured to enable the head to pass upwardly there through. The interlocking system also includes a second keyhole in a second module. The second keyhole is configured to enable the first attachment feature to slide downwardly there through such that axial rotation of the shaft causes the first attachment feature to become misaligned with the second keyhole and abut a lower surface of the second module such that disengagement of the key from the second keyhole is resisted. The interlocking system also includes a second attachment feature on a lower surface of the second module. The second attachment feature is configured to engage with the first attachment feature when the first attachment feature is rotated about an axis of the shaft and the engagement between the first and second attachment features maintains the first attachment feature in misalignment with the second keyhole.

In yet another embodiment, a method for connecting a programmable module to an automation controller is provided. The method includes passing a head of a key upwardly through a first keyhole in a cover of the programmable module. The head is located on a first distal end of a shaft of the key. The method also includes abutting a mating surface of the cover of the programmable module with a mating surface of a cover of an automation controller such that the first keyhole aligns with a second keyhole in the cover of the automation controller, passing a first attachment feature cantilevered from a second distal end of the shaft downwardly through the second keyhole, axially rotating the shaft to cause the first attachment feature to become misaligned with the second keyhole and abut a lower surface of the cover of the automation controller such that disengagement of the key from the second keyhole is resisted, wherein axially rotating the shaft causes coupling between a second attachment feature on a lower surface of the cover of the automation controller with the first attachment feature such that the coupling between the first and second attachment features maintains the first attachment feature in misalignment with the second keyhole.

DRAWINGS

These and other features, aspects, and advantages of the present disclosure will become better understood when the following detailed description is read with reference to the accompanying drawings in which like characters represent like parts throughout the drawings, wherein:

FIG. 3 illustrates a perspective view of a cover of an automation controller and a pair of attached programmable modules in accordance with an embodiment of the present technique;

FIG. 4 illustrates an exploded perspective view of a key assembly in accordance with an embodiment of the present technique;

FIG. 5 illustrates an assembled perspective view of a key assembly in accordance with an embodiment of the present technique;

FIG. 6 illustrates an exploded perspective view of a key assembly and a cover of a programmable module in accordance with an embodiment of the present technique;

FIG. 7 illustrates a bottom perspective view of a cover of an automation controller in accordance with an embodiment of the present technique;

FIG. 8 illustrates a bottom perspective view of a keyhole of a cover of an automation controller in accordance with an embodiment of the present technique;

FIG. 11 illustrates a top view of covers of programmable modules in accordance with an embodiment of the present technique;

FIG. 12 illustrates a bottom view of a cover of an automation controller in accordance with an embodiment of the present technique;

FIG. 15 illustrates a top perspective view of a key in accordance with an embodiment of the present technique;

FIG. 16 illustrates a bottom perspective view of a key in accordance with an embodiment of the present technique;

FIG. 17 illustrates a top perspective view of a keyhole in accordance with an embodiment of the present technique;

FIG. 18 illustrates a bottom perspective view of a key and keyhole in an unlocked position in accordance with an embodiment of the present technique;

FIG. 19 illustrates a bottom perspective view of a key and keyhole in a locked position in accordance with an embodiment of the present technique;

DETAILED DESCRIPTION

Figure 1:
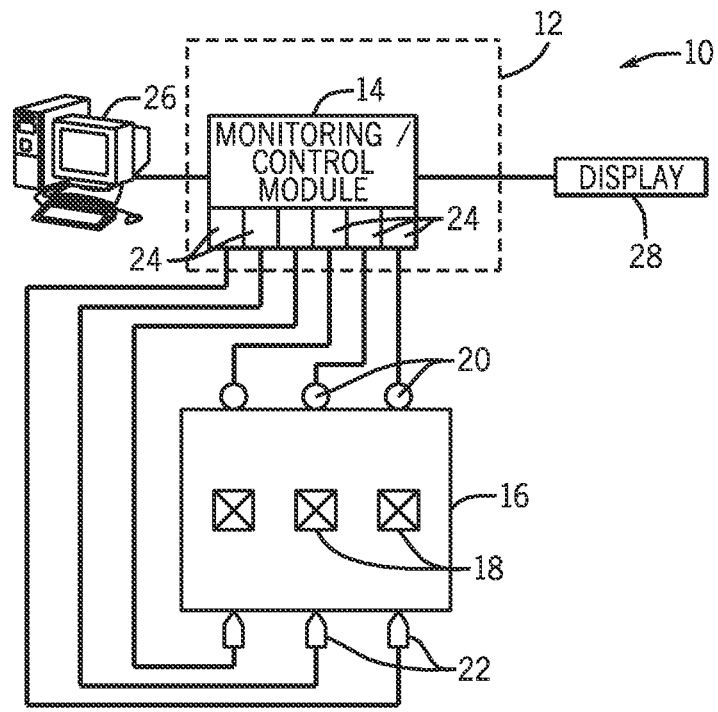
FIG. 1 illustrates a block diagram of an industrial automation and control system in accordance with an embodiment of the present technique.

While the present disclosure may be susceptible to various modifications and alternative forms, specific embodiments have been shown by way of example in the drawings and tables and have been described in detail herein. However, it should be understood that the embodiments are not intended to be limited to the particular forms disclosed. Rather, the disclosure is to cover all modifications, equivalents, and alternatives falling within the spirit and scope of the disclosure as defined by the following appended claims. Further, although individual embodiments are discussed herein to simplify explanation, the disclosure is intended to cover all combinations of these embodiments.

As discussed in detail below, embodiments of the present technique function to provide an interlocking system for connecting programmable modules with automation controllers of an industrial control and automation system. PLCs are examples of automation controllers. In particular, the present technique provides attachment features that help prevent inadvertent disengagement of the programmable modules and associated automation controllers. Specifically, the attachment features help prevent disengagement caused by vibration, shock, or similar forces. The use of the interlocking system of the present technique does not preclude use of traditional attachment features.

Turning now to the drawings and referring first to FIG. 1, an exemplary industrial automation and control system 10 is illustrated. The system 10 includes an enclosure 12, such as an electrical cabinet, in which electrical components, such as monitoring and/or control components, are housed. Examples of such components may include relays, motor starters, and PLCs, among others. The enclosure 12 may be suitable, for example, for assembly of a motor control center or use with industrial, commercial, marine, or other electrical systems. The enclosure 12 may be made of any suitable material, such as heavy gage sheet metal, reinforced plastics, and so forth. In certain embodiments, the enclosure 12 includes individual compartments or other structures that support the electrical components.

In the illustrated embodiment, the system 10 includes a monitoring/control module 14 assembled in accordance with present techniques. The monitoring/control module 14, which may include an automation controller or a PLC, is adapted to interface with components of a machine system or process 16. It should be noted that such an interface in accordance with embodiments of the present techniques may be facilitated by the use of certain network strategies. Indeed, an industry standard network may be employed, such as DeviceNet, to enable data transfer. Such networks permit the exchange of data in accordance with a predefined protocol, and may provide power for operation of networked elements.

The process 16 may take many forms and include devices for accomplishing many different and varied purposes. For example, the process 16 may comprise a compressor station, an oil refinery, a batch operation for making food items, a mechanized assembly line, and so forth. Accordingly, the process 16 may comprise a variety of operational components 18, such as electric motors, valves, actuators, temperature elements, pressure sensors, or a myriad of manufacturing, processing, material handling and other applications. Further, the process 16 may comprise control and monitoring equipment for regulating process variables through automation and/or observation. For example, the illustrated process 16 comprises sensors 20 and actuators 22. The sensors 20 may comprise any number of devices adapted to provide information regarding process conditions. The actuators 22 may include any number of devices adapted to perform a mechanical action in response to an input signal.

As illustrated, the sensors 20 and actuators 22 are in communication with the monitoring/control module 14 (e.g., an automation controller). In one embodiment, the sensors 20 and actuators 22 may communicate with the monitoring/control module 14 via one or more I/O modules 24 coupled to the monitoring/control module 14. The I/O modules 24 may transfer input and output signals between the monitoring/control module 14 and the controlled process 16. In certain embodiments, the sensors 20 and actuators 22 may be utilized to operate process equipment. Indeed, they may be utilized within process loops that are monitored and controlled by the process 16. Such a process loop may be activated based on process inputs (e.g., input from a sensor 20) or direct operator input received through a user interface device 26.

The I/O modules 24 may be integrated with the monitoring/control module 14, or may be added or removed via expansion slots, bays, or other suitable mechanism. For example, to add functionality to the monitoring/control module 14, additional I/O modules 24 may be added. Specifically, for example, new sensors 20 or actuators 22 may be added to control the process 16 and additional I/O modules 24 may be added to support the new sensors 20 and actuators 22. These I/O modules 24 serve as an electrical interface to the monitoring/control module 14 and may be located proximate or remote from the monitoring/control module 14, including remote network interfaces to associated systems.

The I/O modules 24 may include input modules that receive signals from input devices, such as photo-sensors and proximity switches, output modules that use output signals to energize relays or to start motors, and bidirectional I/O modules, such as motion control modules, which can direct motion devices and receive position or speed feedback. In some embodiments, the I/O modules 24 may convert between AC and DC analog signals used by devices on a controlled machine or process and +5-volt DC logic signals used by the monitoring/control module 14. Additionally, some of the I/O modules 24 may provide digital signals to digital I/O devices and receive digital signals from digital I/O devices. Further, in some embodiments, the I/O modules 24 that are used to control motion devices or process control devices may include local microcomputing capability on the I/O module.

In some embodiments, the I/O modules 24 may be located remotely from the monitoring/control module 14. In these embodiments, data is communicated with the remote modules over a common communication link, or network, wherein modules on the network communicate via a standard communications protocol. Many industrial controllers can communicate via network technologies, such as Ethernet (e.g., IEEE802.3, TCP/IP, UDP, EtherNet/IP, and so forth), ControlNet, DeviceNet, or other network protocols (Foundation Fieldbus (H1 and Fast Ethernet) Modbus TCP, Profibus), and also communicate to higher level computing systems In the illustrated embodiment, the system 10 also includes a display 28, such as an LCD or other display, configured to display output parameters, such as operating parameters of the process 16, temperatures or pressures sensed by the sensors 20, position information of the actuators 22, and so forth.

Figure 2:
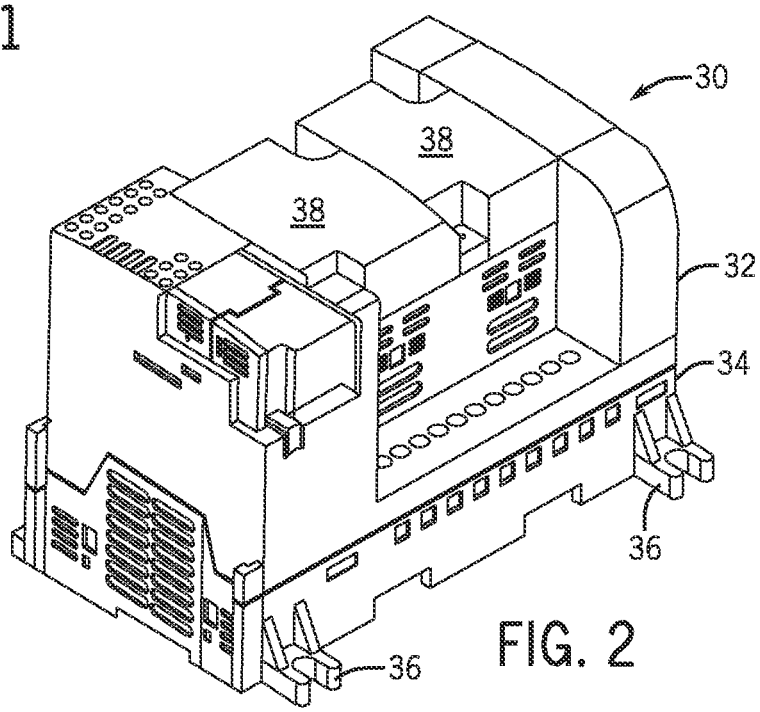
FIG. 2 illustrates a perspective view of an automation controller in accordance with an embodiment of the present technique.

FIG. 2 is a perspective view of an automation controller 30, such as a PLC. As illustrated, the automation controller 30 includes a variety of components and features that facilitate assembly and/or operation of the automation controller 30. For example, the automation controller 30 may include any number of slots, vents, plugs, connectors, and/or other interface structures. Such structures may facilitate operation of the automation controller 30, coupling between assembly components, coupling with other features (e.g., a DIN rail), and/or operation of the automation controller 30. Certain features of the automation controller 30 may be coupled (e.g., via plug-in connections) to a backplane that provides for distribution of power and data signals. Such backplanes are currently in use throughout industrial applications to provide data and control signals to and from automation controllers, computer components and peripherals, and so forth.

The automation controller 30 may include a cover 32 and a base 34. The cover 32 may enclose internal components of the automation controller 30 to protect the internal components from inadvertent operation, tampering, manipulation, exposure to dust and/or debris, and so forth. In addition, the cover 32 may be configured to enable other components to be connected or attached to the automation controller 30 as described in detail below. The cover is coupled to the base 34, which may also help to enclose and/or protect the internal components of the automation controller 30. The base 34 may also be used to install the automation controller 30 in the enclosure 12. Indeed, the automation controller 30 includes features configured to facilitate attachment of the automation controller 30 to a support (e.g., a wall of an electrical cabinet). Specifically, the automation controller 30 shown in FIG. 2 includes attachment features 36, which are configured to facilitate coupling of the automation controller 30 with a panel or a rail. For example, in certain embodiments, the automation controller 30 may be secured to an electrical cabinet using fasteners that pass through the attachment features 36 into a back panel of the electrical cabinet. In other embodiments, other attachment features are configured to couple these components with DIN rails.

In certain embodiments, the automation controller 30 may include expansion and communication features. For example, the automation controller 30 may include interface slots, communication ports, and/or receptacles configured to receive one or more fasteners to secure them to the panel. Specifically, the automation controller 30 in the illustrated embodiment includes ports to receive programmable modules 38, which may be adapted to manage aspects of the automation controller 30. A variety of such modules 38 may be coupled to the automation controller 30 for performing the control/monitoring function of a specified process or system. In the illustrated embodiment, the programmable modules 38 may be connected to the automation controller 30 using exemplary interlocking systems described in detail below. The interlocking systems include features on mating surfaces of the programmable modules 38 and the automation controller 30 for securing the programmable modules 38 to the automation controller 30.

FIG. 3 is a perspective view of the automation controller cover 32 of the interlocking system. In the illustrated embodiment, two programmable modules 38 are attached to the cover 32. In the discussion that follows, references to the programmable modules 38 may also refer to covers of the programmable modules 38. As shown in FIG. 3, the cover 32 has an upper surface 50 and a lower surface 52. The upper surface 50 may generally face a user interacting with the automation controller 30, and the lower surface 52 may generally face toward the internal components of the automation controller 30. The programmable modules 38 may be attached to the cover 32 using key assemblies 54, which are described in detail below. As shown in FIG. 3, the key assemblies 54 may be located near an edge 56 of the programmable modules 38. Such a configuration of the key assemblies 54 and the programmable modules 38 may reduce interference between internal components of the programmable modules 38 and the key assemblies 54. In other embodiments, the key assemblies 54 may not be located near the edges 56. In the illustrated embodiment, two key assemblies 54 are used to secure each programmable module 38 to the cover 32. In other embodiments, additional key assemblies may be used to attach the programmable modules 38 to the cover 32. For example, three, four, five, six, or more key assemblies 54 may be used in various embodiments. As shown in FIG. 3, the key assemblies 54 are located at diagonally opposite corners of the programmable module 38. When two key assemblies 54 are used, such a configuration may help to securely attach the programmable module 38 to the cover 32. Other embodiments of the cover 32 may include fewer or more slots for programmable modules 38, such as one, three, four, five, six, or more slots. In addition, each of the one or more programmable modules 38 may be independently removable from the cover 32 by selectively disengaging the appropriate key assemblies 54. Moreover, the number and/or size of the key assemblies 54 and corresponding keyholes may be configured based upon a size of the programmable module 38 and/or the automation controller 30.

FIG. 4 shows an exploded perspective view of the key assembly 54. In the illustrated embodiment, the key assembly 54 includes a head receptacle 70 and a key 72, which are aligned to fit together along a lengthwise axis 74 of the key 72. The head receptacle 70 includes an upper surface 76 and a lower surface 78. When the head receptacle 70 is installed on the key 72, which is disposed in the programmable module 38, the upper surface 76 may remain accessible to the user. As shown in FIG. 4, the head receptacle 70 is a generally cylindrical object that includes a generally cylindrical opening 80. In other embodiments, the head receptacle 70 may be configured in other shapes, such as a square, rectangle, triangle, oval, or other shape. The opening 80 may be formed entirely through the head receptacle 70 from the top surface 76 to the lower surface 78. The opening 80 may have a diameter 82, which may be between approximately 2 mm to 3 mm in certain embodiments. An indicator 84 may be formed in the top surface 76 of the head receptacle 70. The indicator 84 may be used together with an indicator formed in the programmable module 38 to indicate whether the key assembly 54 is in an unlocked or locked position as discussed in detail below. In other embodiments, the indicator 84 alone may indicate whether the key assembly 54 is in locked or unlocked positions. The indicator 84 may be a raised portion of the head receptacle 70 or any other mark observable to the user. For example, the indicator 84 may be a triangular raised portion of the head receptacle 70. Indentations 86 may be formed near the top surface 76, which may help the user grip the head receptacle 70 when turning the head receptacle 70. In addition, the indentations 86 may be configured to mate with a tool to help turn the key assembly 54. Although compatible with tools, turning of the key assembly 54 may be accomplished without tools (i.e., toollessly). Further, the head receptacle 70 may have a height 88 and a diameter 90. For example, the height 88 may be between approximately 5 mm to 6 mm and the diameter 90 may be between approximately 3 mm to 4 mm.

The key 72 shown in FIG. 4 may include a shaft 92, which may be a solid cylindrical rod. The shaft 92 includes a first distal end 94 and a second distal end 96. A head 98 located on the first distal end 94 is configured to engage with the head receptacle 70. For example, the head 98 may include grooves configured to engage with protrusions located inside the opening 80, which may help couple the head receptacle 70 and key 72. Thus, rotation of the head receptacle 70 also rotates the connected key 72. Further, the head 98 includes a cavity 100, which may be configured to mate with a tool to help rotate the key assembly 54. For example, the cavity 100 is slot-shaped and thus, may be compatible with a slotted screwdriver. Therefore, the key assembly 54 may be rotated by turning the key 72 via the cavity 100. A first attachment feature 102 is cantilevered from the second distal end 96. The first attachment feature 102 may be used to engage with the cover 32 as described in detail below. In the illustrated embodiment, the first attachment feature 102 includes a groove 104, which is arranged substantially parallel to the axis 74, and an associated hook 106. Operation of the attachment feature 102 is described in detail below. The shaft 92 also includes a lug 108 cantilevered from a side of the shaft 92 between the first and second distal ends 94 and 96. The lug 108 may be configured to engage with aspects of the programmable module 38 as described in detail below. Further, the key 72 may have a height 110 and a diameter 112. The height 110 may be between approximately 5 cm to 6 cm and the diameter 112 may be between approximately 1 cm to 1.5 cm.

FIG. 5 illustrates an assembled perspective view of the key assembly 54. As shown in FIG. 5, the head receptacle 70 fits on the first distal end 94 of the key 72. In addition, the upper surface 76 of the head receptacle 70 may be flush with the top of the head 98 of the shaft 92. The interior surface of the opening 80 and the head 98 may be configured such that force is required to disengage the head receptacle 70 from the key 72 after they have been coupled.

FIG. 6 illustrates an exploded perspective view of the key assembly 54 and the programmable module 38. The programmable module 38 includes an upper surface 130 and a lower surface 132. The upper surface 130 may generally face a user interacting with the programmable module 38, and the lower surface 132 may generally face toward internal components of the programmable module 38. In the illustrated embodiment, a first keyhole 134 is formed through the programmable module 38. Various embodiments of the programmable module 38 may include one or more first keyholes 134. The shape of the first keyhole 134 is generally circular to match the shape of the head receptacle 70 and to enable the head receptacle 70 to rotate. Further, the first keyhole 134 has an upper diameter 136, which may be approximately the same as or slightly greater than the diameter 90 of the head receptacle 70. Thus, the head receptacle 70 may fit snugly into the first keyhole 134 when slid downwardly in the direction of arrow 138. A lower diameter (not shown) of the first keyhole 134 may be less than the diameter 90. Thus, the head receptacle 70 may be sized to prevent passage of the head receptacle 70 through the first keyhole 134. The head 98 of the key 72 may pass upwardly through the first keyhole 134 as indicted by arrow 140. The lug 108 is configured to engage the bottom surface 132 of the programmable module 38 upon insertion of the head 98 into the first keyhole 134 such that further insertion of the head 98 into the first keyhole 134 is resisted. Once the head receptacle 70 couples with the head 98 extending through the first keyhole 134, the key assembly 54 may be securely attached to the programmable module 38. In addition, engagement of the head receptacle 70 with the head 98 may resist removal of the head 98 from the first keyhole 134.

FIG. 7 illustrates a perspective view of the lower surface 52 of the cover 32. A second keyhole 150 may be formed in the cover 32 to engage with the first attachment feature 102 of the key assembly 54 shown in FIG. 4 as described in detail below. Various embodiments of the cover 32 may include one or more second keyholes 150. The second keyhole 150 may be formed in the cover 32 such that the second keyhole 150 aligns with the first keyhole 134 when the programmable module 38 is coupled to the cover 32.

FIG. 8 illustrates a bottom perspective view of the second keyhole 150 in the lower surface 52. The second keyhole 150 may include a first opening 152 and a second opening 154. The first opening 152 may be configured to enable the shaft 92 of the key 72 to pass through the second keyhole 150. The first opening 152 may include a diameter 156, which is approximately the same as or slightly greater than the diameter 112 of the shaft 92. The shape of the first opening 152 may be circular to match the shape of the shaft 92 and to enable the key assembly 54 to rotate. The second opening 154 may be configured to enable the first attachment feature 102 to slide downwardly through the second keyhole 150. In addition, a second attachment feature 158 may be formed on the lower surface 52 of the cover 32 adjacent to the second keyhole 150. The second attachment feature 158 may be a cylindrical rod-shaped protrusion with a diameter 160 and height 162. For example, the diameter 160 may be between approximately 0.5 mm to 1 mm and the height 162 may be between 3 mm to 4 mm. The second attachment feature 158 may be configured to engage the first attachment feature 102 when the first attachment feature 102 is rotated about the axis 74 of the shaft 92. In other words, the second attachment feature 158 may be configured to fit in the groove 104 of the first attachment feature 102. As shown, the second keyhole 150 is not threaded and is asymmetrical. Thus, the second keyhole 150 is not compatible with threaded devices, such as screws. In addition, the first keyhole 134 and the key 72 are not threaded. Thus, embodiments of the interlocking system are not compatible with threaded devices.

Figure 9:
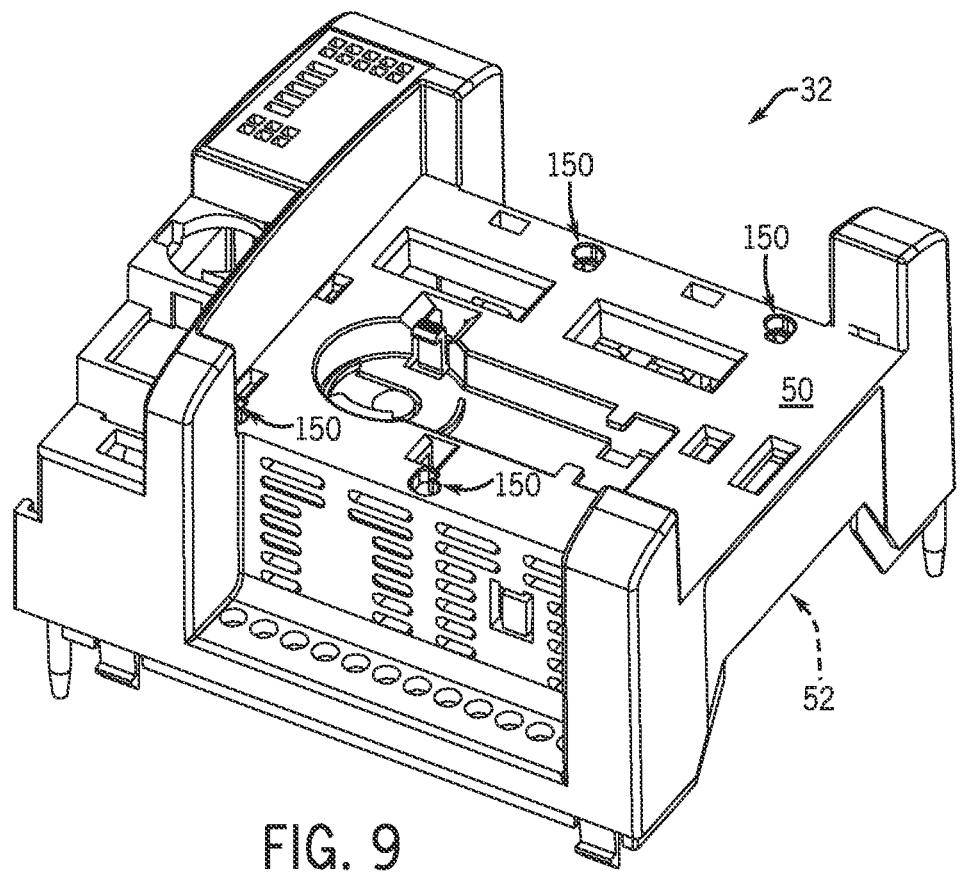
FIG. 9 illustrates a top perspective view of a cover of an automation controller in accordance with an embodiment of the present technique.

FIG. 9 is a perspective view of the upper surface 50 of the cover 32. In various embodiments, the number of second keyholes 150 may correspond to the number of first keyholes 134 in the programmable modules 38. For example, FIG. 9 shows four second keyholes 150.

Figure 10:
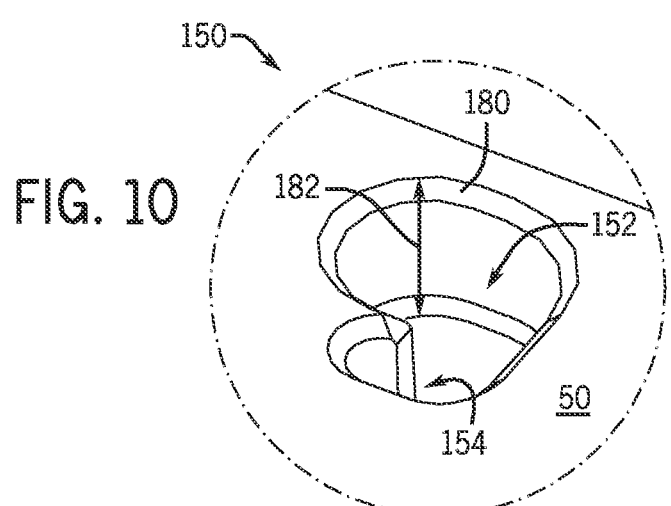
FIG. 10 illustrates a top perspective view of a keyhole of a cover of an automation controller in accordance with an embodiment of the present technique.

FIG. 10 is a top perspective view of the second keyhole 150 in the upper surface 50 of the cover 32. As shown in FIG. 10, the second keyhole 150 includes the first opening 152 and the second opening 154. In addition, the periphery of the second keyhole 150 includes a beveled edge 180, which may help the shaft 92 and the first attachment feature 102 to pass smoothly into the second keyhole 150. Indeed, the beveled edge 180 facilitates alignment and essentially guides the first attachment feature 102 through the second keyhole 150. In addition, the second keyhole 150 has a height 182, which may be approximately the same as a thickness of the cover 32. For example, the height 182 may be between approximately 2 mm to 3 mm.

FIG. 11 illustrates a top view of the programmable modules 38. An indicator 200 may be formed in the top surface 130 of the programmable modules 38. The indicator 200 may be a raised portion of the programmable modules 38 or any other mark observable to the user. For example, the indicator 200 may be a triangular raised portion of the programmable modules 38. The indicator 200 may be used in conjunction with the indicator 84 of the head receptacle 70 to indicate the position of the key assembly 54. In the illustrated embodiment, the indicators 200 and the indicators 84 of the upper two key assemblies 54 are aligned. Thus, the upper two key assemblies 54 are in the locked position. In the illustrated embodiment, the indicators 200 and the indicators 84 of the lower two key assemblies 54 are not aligned. Thus, the lower two key assemblies 54 are in the unlocked position. Therefore, the indicator 84 and the indicator 200 may help a user to tell at a glance whether the key assemblies 54 are in the locked or unlocked positions.

FIG. 12 illustrates a bottom view the lower surface 52 of the cover 32. In the illustrated embodiment, the first attachment features 102 illustrated toward the top of FIG. 12 are engaged with the corresponding second attachment features 158. Thus, these two first attachment features 102 are in the locked position. The two first attachment features 102 illustrated toward the bottom of FIG. 12 are not engaged with the corresponding two second attachment features 158. Thus, these two first attachment features 102 are in the unlocked position. The locked and unlocked positions are described in more detail below.

Figure 13:
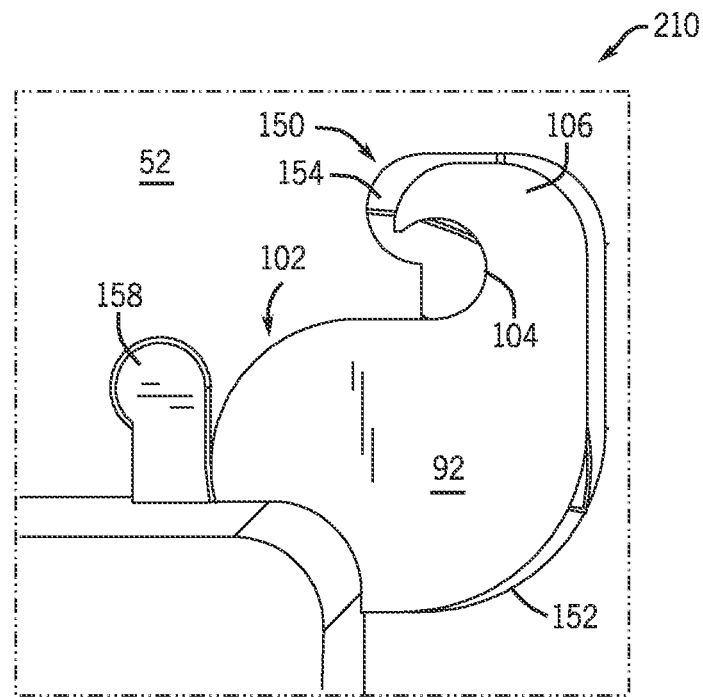
FIG. 13 illustrates a bottom view of first and second attachment features in an unlocked position in accordance with an embodiment of the present technique.

FIG. 13 is a bottom view of an unlocked position 210 of the first attachment feature 102. As shown in FIG. 13, the first attachment feature 102 extends through the second keyhole 150. Specifically, the shaft 92 fits through the first opening 152. In addition, the groove 104 and the hook 106 fit through the second opening 154. Because the groove 104 has not engaged the second attachment feature 158, the key assembly 54 is in the unlocked position 210. In other words, the first attachment feature 102 is aligned with the second keyhole 150, and thus, the key assembly 54 can still be removed from the cover 32.

Figure 14:
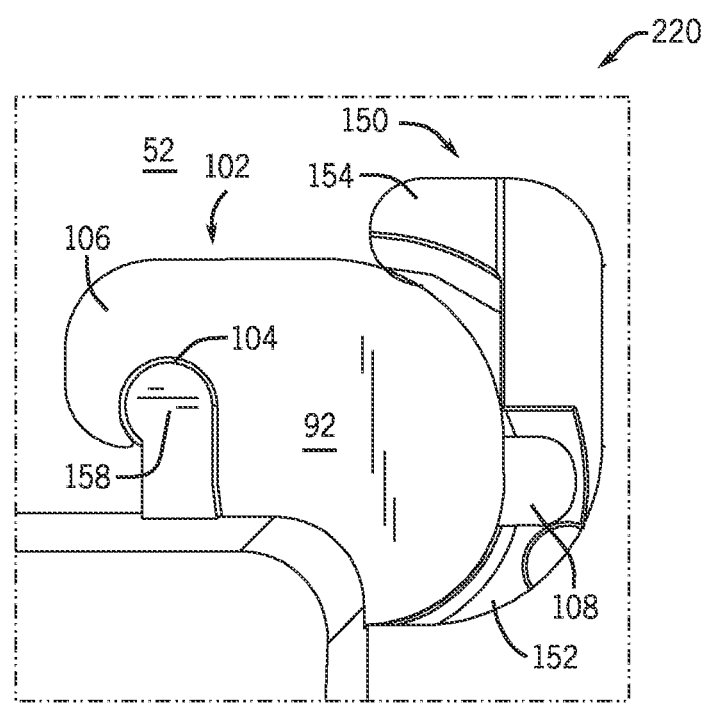
FIG. 14 illustrates a bottom view of first and second attachment features in a locked position in accordance with an embodiment of the present technique.

FIG. 14 is a bottom view of a locked position 220 of the first attachment feature 102. In the illustrated embodiment, the shaft 92 has been axially rotated approximately ninety degrees counterclockwise from the unlocked position 210, thereby engaging the groove 104 of the first attachment feature 102 with the second attachment feature 158. In addition, axial rotation of the shaft 92 causes the first attachment feature 102 to become misaligned with the second keyhole 150. Thus, the first attachment feature 102 abuts the lower surface 52 of the cover 32 such that disengagement of the key 72 from the second keyhole 150 is resisted. Further, the engagement between the first and second attachment features 102 and 158 maintains the first attachment feature 102 in misalignment with the second keyhole 150. Thus, the first attachment feature 102 is in the locked position 220 in FIG. 14. Because of the cylindrical shape of the second attachment feature 158 and the configuration of the hook 106, the first attachment feature 102 snaps into place when engaged with the second attachment feature 158. In other words, the hook 106 may flex slightly outward to enable the second attachment feature 158 to engage fully with the groove 104. The snapping of the first attachment feature 102 when moved into the locked position 220 may provide the user a tactile sensation indicative of the key assembly 54 being in the locked position 220. In other words, the user receives the tactile sensation when the first attachment 102 engages the second attachment feature 158. Rotation of the shaft 92 clockwise to the unlocked position 210 may not occur naturally during normal operation of the industrial automation and control system 10, which may include shock, vibration, and similar forces. Thus, use of the rotating key assembly 54 in various embodiments helps to prevent disengagement of the programmable module 38 from the cover 32.

FIGS. 15-19 show components of another embodiment of the interlocking system. FIG. 15 illustrates a top perspective view of a key 230. The key 230 has a first distal end 232 and a second distal end 234. A head 236 is located near the top distal end 232. The head 236 may engage with a first keyhole formed in the programmable module 38 in a similar way as the head receptacle 70 fits in the first keyhole 134. A flexible portion 238 is located near the second distal end 234. The flexible portion 238 engages with the automation controller cover 32, as described in detail below. A slot 240 is formed in the top surface of the head 236. The slot 240 is configured to mate with a tool to facilitate turning of the key 230. An indicator 242 is formed in the top surface of the head 236 to indicate to the user whether the key 230 is in the locked or unlocked positions. A first hook 244 is formed on a side of the key 230 between the head 236 and the flexible portion 238. The first hook 244 is configured to engage with the programmable module 38 to help prevent the key 230 from being removed from the programmable module 38 after being inserted. A second hook 246 is formed near the second distal end 234. The second hook 246 is configured to engage with the cover 32, as described in detail below.

FIG. 16 illustrates a bottom perspective view of the key 230. As shown in FIG. 16, the flexible portion 238 includes a segment of a complete cylinder. In other words, a radial cross-section of the flexible portion 238 may appear as an arc instead of a circle. Specifically, the flexible portion 238 may be defined by an angle 248, which may be approximately 120 degrees. Configurations of the flexible portion 238 where the angle 248 is less than approximately 180 degrees may enable the flexible portion 238 to flex toward or away from the lengthwise axis 74 of the key 230.

FIG. 17 illustrates a top perspective view of a second keyhole 260 configured to engage the key 230. Specifically, the second keyhole 260 includes an open portion 262, which corresponds to the flexible portion 238. The open portion 262 is large enough to enable the flexible portion 238 to be inserted and to rotate approximately 90 degrees. The second keyhole 260 includes a triangular shaped insert 264, which is configured to limit rotation of the key 230 to approximately 90 degrees. The second keyhole 260 may also include a beveled edge 266, which may help to align the programmable module 38 and the cover 32 by mating with correspondingly shaped feature formed in the lower surface 132 of the programmable module 38.

FIG. 18 is a bottom perspective view of the second keyhole 260 in an unlocked position 280. As shown in FIG. 18, the second keyhole 260 includes a crescent-shaped slot 282, which may accommodate the second hook 246 of the key 230. As the key rotates counterclockwise, the crescent-shaped slot 282 becomes shallower, which results in guiding or pushing the second hook 246 inward and moving the flexible portion 238 inward toward the lengthwise axis 74 of the key 230.

FIG. 19 shows a bottom perspective view of the second keyhole 260 in a locked position 290. As shown in FIG. 19, the second hook 246 has engaged in a slot 284 formed in the second keyhole 260. The slot 284 enables the flexible portion 238 to snap outward away from the lengthwise axis 74 of the key 230. In addition, the configuration of the second hook 246 and the slot 284 helps the key 230 to resist moving out of the locked position 290.

Figure 20:
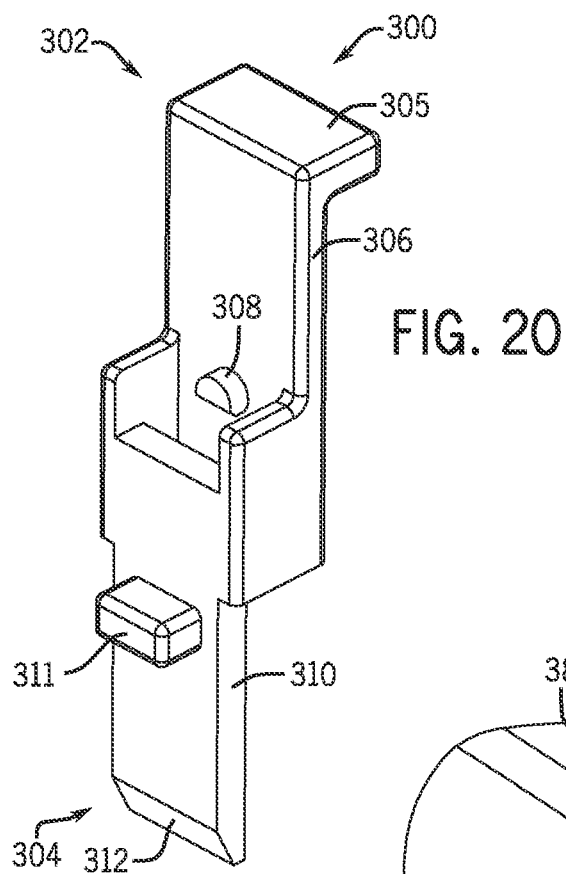
FIG. 20 illustrates a top perspective view of a plunger in accordance with an embodiment of the present technique.

FIGS. 20-23 illustrate components of a further embodiment of the interlocking system. FIG. 20 illustrates a top perspective view of a plunger 300. The plunger 300 includes a first distal end 302 and a second distal end 304. The plunger 300 includes a top surface 305 configured to enable the user to push downward on the plunger 300. The plunger 300 includes an upper support 306 and a lug 308 formed on the upper support 306. A lower support 310 is connected to the upper support 306 and a tab 311 is formed on the lower support 310. Further, a beveled edge 312 is formed on the bottom of the lower support 310.

Figure 21:
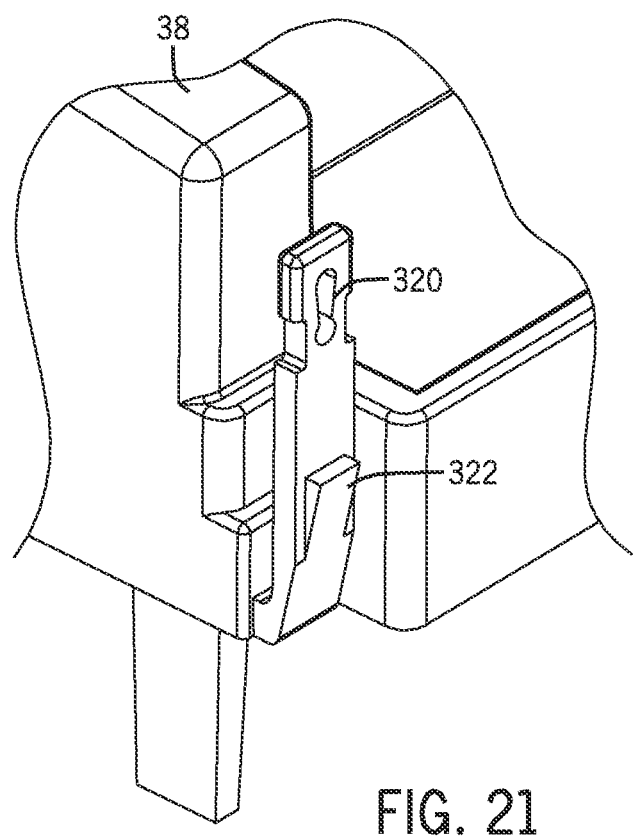
FIG. 21 illustrates a top perspective view of a cover of a programmable module in accordance with an embodiment of the present technique.

FIG. 21 illustrates a top perspective view of the programmable module 38 configured to interlock with the plunger 300. In FIG. 21, the programmable module 38 includes an opening 320 configured to engage the lug 308. Specifically, the opening 320 is wide near the top and bottom, but narrow in the middle. The programmable module 38 also includes a locking feature 322, which engages the cover 32 to help resist disassembly of the programmable module 38 and the cover 32.

Figure 23:
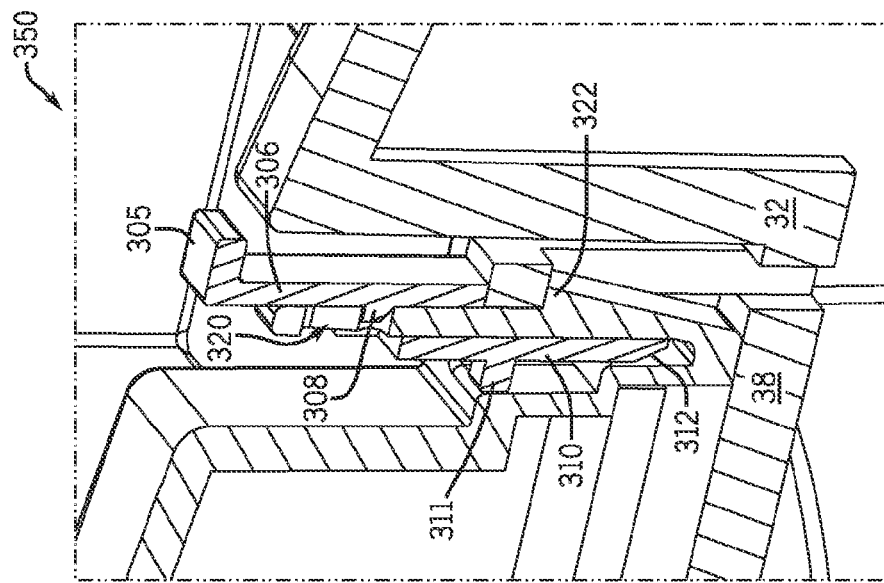
FIG. 23 illustrates a cross-sectional view of a plunger in a locked position in accordance with an embodiment of the present technique.
Figure 22:
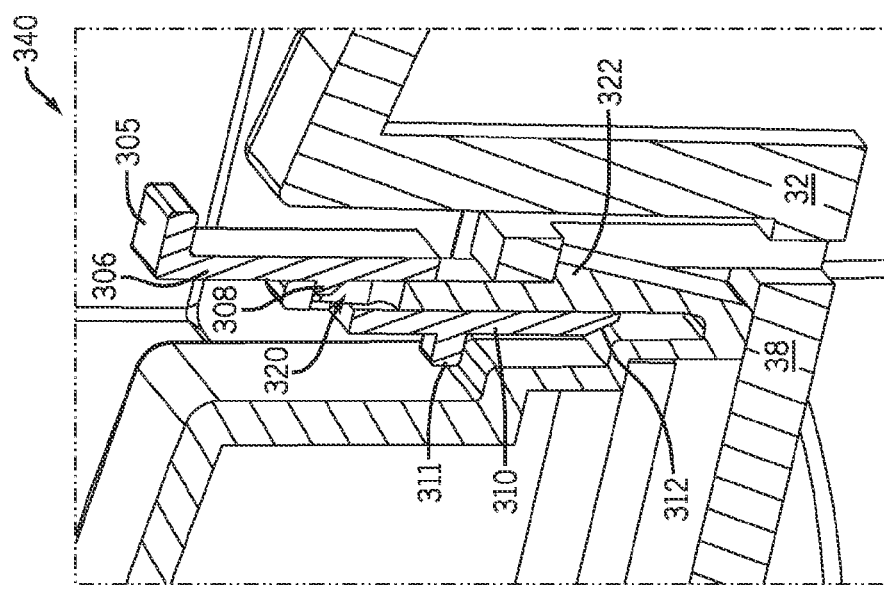
FIG. 22 illustrates a cross-sectional view of a plunger in an unlocked position in accordance with an embodiment of the present technique.

FIG. 22 illustrates a cross-sectional view of the plunger 300 in an unlocked position 340. As shown in FIG. 22, the lug 308 is located near the top of the opening 320. During insertion or attachment, the lug 308 and/or the opening 320 deform to allow the lug 38 to pass the narrow portion of the opening 320 and interlock with the lower portion of the opening 320. FIG. 23 illustrates a cross-sectional view of the plunger 300 in a locked position 350. As shown in FIG. 23, the lug 308 is engaged and located near the bottom of the opening 320. Thus, the lug 308 has moved past the narrow portion of the opening 320. Such a configuration of the opening 320 may help restrain the plunger 300 in the locked position 350. In addition, the user may receive a tactile sensation when the lug 308 has moved past the narrow portion of the opening 320. Further, the placement of the lower portion 310 in the programmable module 38 may help prevent the locking feature 322 from bending backward, thereby further resisting disengagement of the programmable module 38 from the cover 32.

Figure 24:
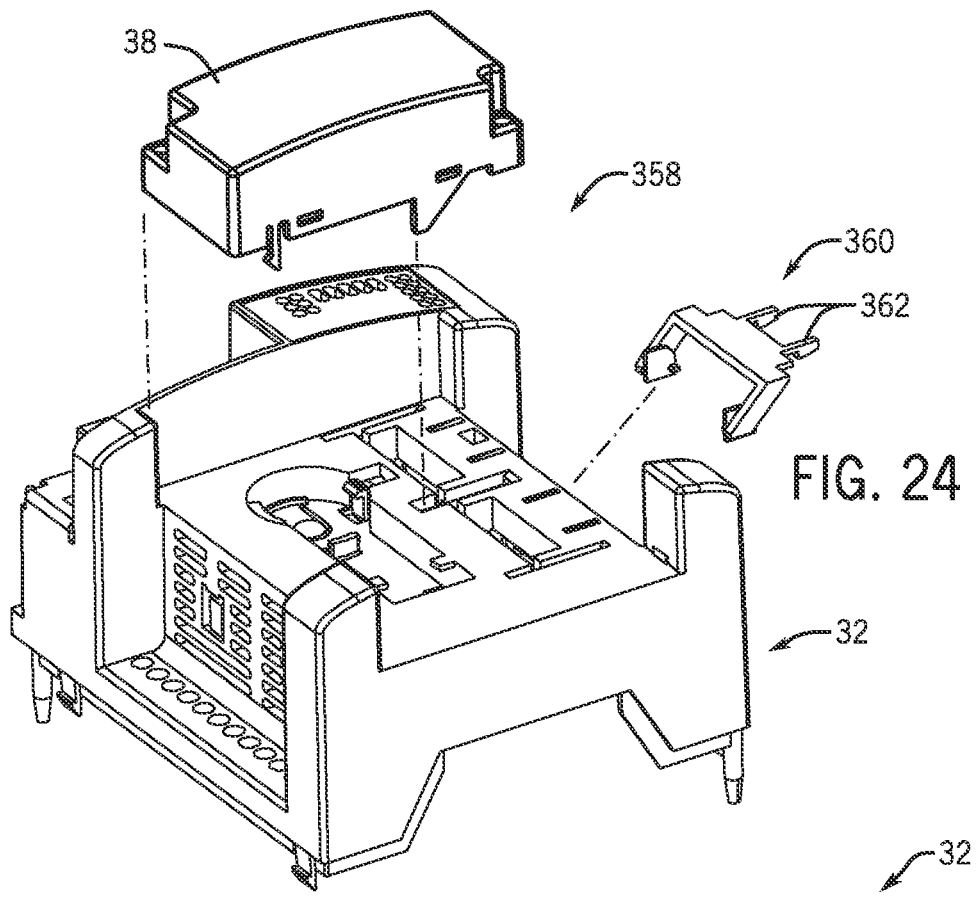
FIG. 24 illustrates an exploded view of a locking system in accordance with an embodiment of the present technique.

FIGS. 24-28 show components of another embodiment of the interlocking system. FIG. 24 illustrates an exploded view of a locking system 358. In the illustrated embodiment, a lock 360 is used to couple the programmable module 38 to the cover 32. The lock 360 includes one or more tabs 362, which indicate whether the lock 360 is locked or unlocked.

Figure 25:
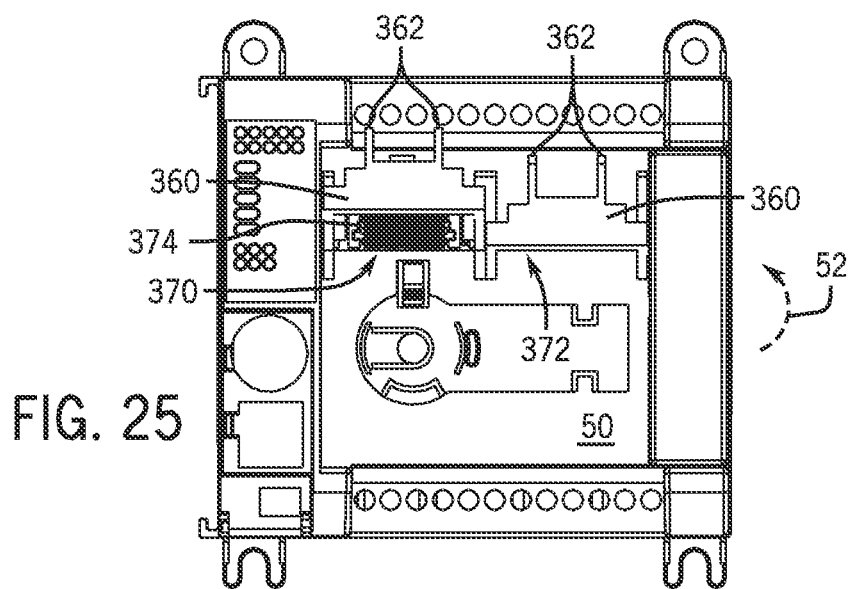
FIG. 25 illustrates a top view of a cover of an automation controller in accordance with an embodiment of the present technique.
Figure 26:
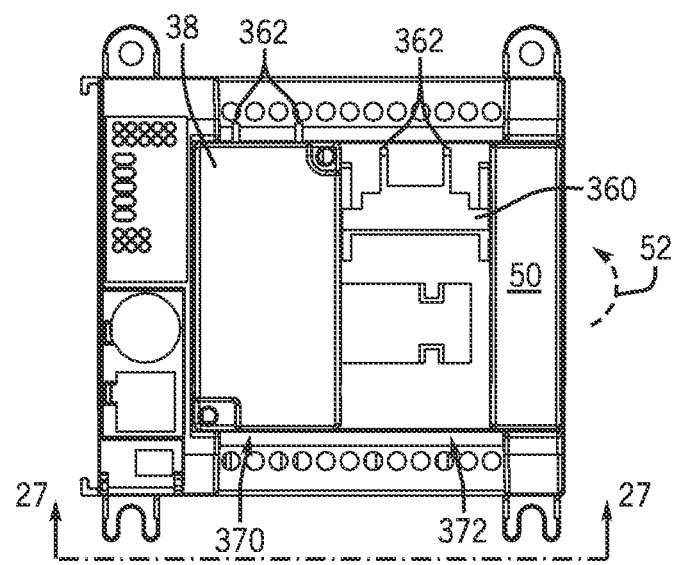
FIG. 26 illustrates a top view of a cover of an automation controller in accordance with an embodiment of the present technique.

FIG. 25 illustrates a top view of the cover 32 incorporating the lock 360. Specifically, the lock 360 on the left of FIG. 25 is in a locked position 370 and the lock 360 on the right of FIG. 25 is in an unlocked position 372. Thus, a connector 374 of the cover 32 is exposed when in the locked position 370. The connector 374 may connect electrically with the programmable module 38. In addition, the tabs 362 are extended in the locked position 370, which may help the user visually identify the status of the locking system 358. FIG. 26 illustrates a top view of the cover 32 with the programmable module 38. As shown, the programmable module 38 is installed on the left with the lock 360 in the locked position 370.

Figure 27:
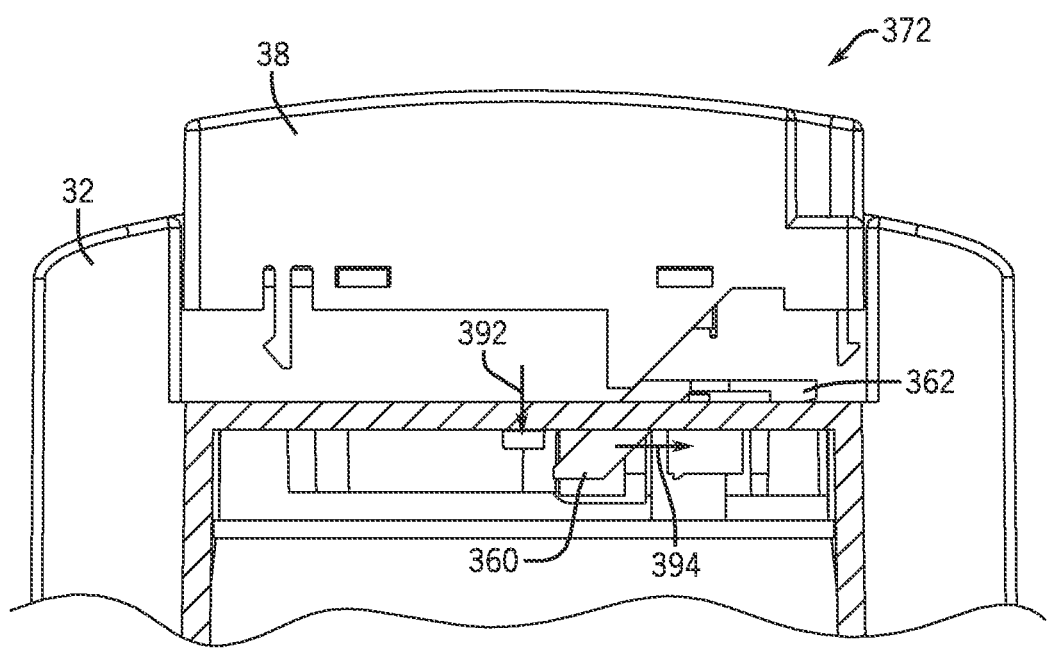
FIG. 27 illustrates a cross-sectional view of a lock in an unlocked position in accordance with an embodiment of the present technique.
Figure 28:
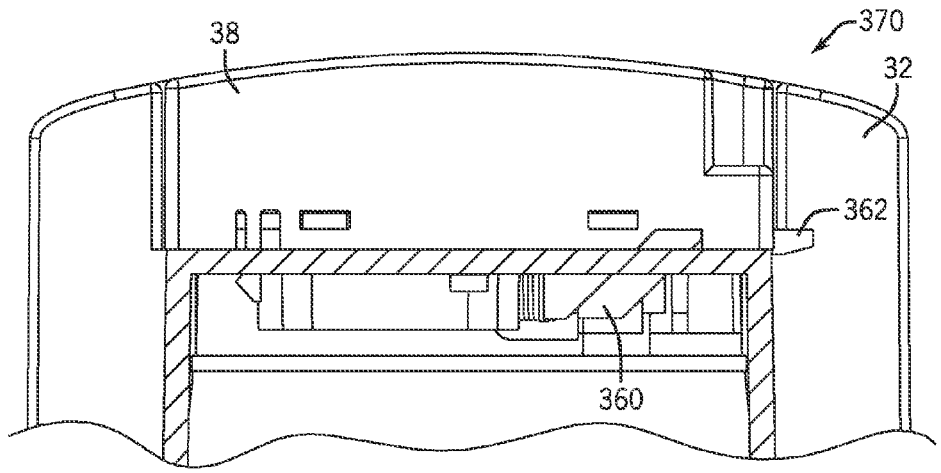
FIG. 28 illustrates a cross-sectional view of a lock in a locked position in accordance with an embodiment of the present technique.

FIG. 27 illustrates a cross-sectional view of the locking system 358 in the unlocked position 372. The programmable module 38 is moved in a downward direction as indicated by arrow 392 to lock the programmable module 38 to the cover 32. As the programmable module 38 moves downward, the lock 360 moves to the right, as indicted by arrow 394. FIG. 28 illustrates a cross-sectional view of the locking system 358 in the locked position 370. As shown in FIG. 28, the tabs 362 extend out from the cover 32 indicating the locked position 370 to the user.

Figure 29:
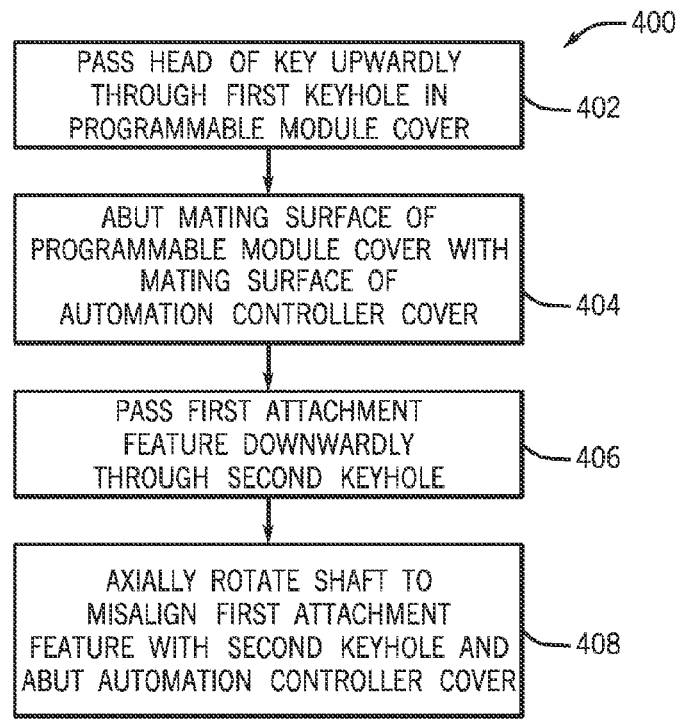
FIG. 29 is a flow chart of a method for connecting a programmable module to an automation controller in accordance with an embodiment of the present technique.

FIG. 29 is a flow chart of a process for connecting the programmable module 38 to the automation controller 30. In the first step 402, the head 98 of the key 72 is passed upwardly through the first keyhole 134 in the programmable module 38. Next, in step 404, the lower surface 132 of the programmable module 38 is abutted with the upper surface 50 of the cover 32 such that the first keyhole 134 aligns with the second keyhole 150. In step 406, the first attachment feature 102 is passed downwardly through the second keyhole 150. Finally, in step 408, the shaft 92 is axially rotated to cause the first attachment feature 102 to become misaligned with the second keyhole 150. As a result of the rotation of the shaft 92, the first attachment feature 102 also abuts the lower surface 52 of the cover 32 such that disengagement of the key assembly 54 from the second keyhole 150 is resisted. Further, the first attachment feature 102 engages the second attachment feature 158 on the lower surface 52 of the cover 32 such that engagement between the first attachment feature 102 and the second attachment feature 158 maintains the first attachment feature 102 in misalignment with the second keyhole 150.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An interlocking system for connecting a programmable module and an automation controller of an industrial control and automation system, the interlocking system comprising:
   a key comprising a shaft with a head on a first distal end of the shaft and a first attachment feature cantilevered from a second distal end of the shaft;
   a first keyhole in a cover of the programmable module, wherein the first keyhole is configured to enable the head to pass upwardly there through;
   a second keyhole in a cover of the automation controller, wherein the second keyhole is configured to enable the first attachment feature to slide downwardly there through such that axial rotation of the shaft causes the first attachment feature to become misaligned with the second keyhole and abut a lower surface of the cover of the automation controller such that disengagement of the key from the second keyhole is resisted; and
   a second attachment feature on the lower surface of the cover of the automation controller, wherein the second attachment feature is configured to engage with the first attachment feature when the first attachment feature is rotated about an axis of the shaft and the engagement between the first and second attachment features maintains the first attachment feature in misalignment with the second keyhole.

2. The system of claim 1, comprising a first plurality of keyholes in the cover of the programmable module and a second plurality of keyholes in the cover of the automation controller.

3. The system of claim 1, comprising a head receptacle configured to slide downwardly onto and couple with the head as the head extends through the first keyhole, wherein the head receptacle is sized to prevent passage of the head receptacle through the first keyhole and engagement with the head resists removal of the head from the first keyhole.

4. The system of claim 3, wherein the head receptacle comprises an indicator configured to indicate whether the key is in a locked position or in an unlocked position.

5. The system of claim 1, wherein the shaft comprises a lug cantilevered from a side of the shaft in between the first and second distal ends of the shaft, and wherein the lug is configured to engage a bottom surface of the cover of the programmable module upon insertion of the head into the first keyhole such that further insertion of the head into the first keyhole is resisted.

6. The system of claim 1, wherein the first attachment feature comprises a groove that is substantially parallel to the axis of the shaft.

7. The system of claim 1, wherein the cover of the programmable module comprises two keyholes formed adjacent to edges of the cover of the programmable module and located diagonally apart from one another.

8. The system of claim 1, wherein the head comprises a cavity configured to mate with a tool to rotate the key.

9. The system of claim 1, wherein the second attachment feature comprises a rod-shaped protrusion formed in the lower surface of the cover of the automation controller.

10. The system of claim 1, wherein the key, the first keyhole, and the second keyhole are not threaded.

11. The system of claim 1, wherein the first attachment feature and the second attachment feature are configured to provide a tactile sensation when the first attachment feature engages the second attachment feature.

12. The system of claim 1, wherein the automation controller comprises a port configured to receive the programmable module, which is adapted to manage aspects of the automation controller.

13. An industrial automation and control system, comprising:
   a plurality of monitoring and/or control modules configured to perform a monitoring and/or control function; and
   an interlocking system configured to connect adjacent monitoring and/or control modules, comprising:
      a key comprising a shaft with a head on a first distal end of the shaft and a first attachment feature cantilevered from a second distal end of the shaft;
      a first keyhole in a first module, wherein the first keyhole is configured to enable the head to pass upwardly there through;
      a second keyhole in a second module, wherein the second keyhole is configured to enable the first attachment feature to slide downwardly there through such that axial rotation of the shaft causes the first attachment feature to become misaligned with the second keyhole and abut a lower surface of the second module such that disengagement of the key from the second keyhole is resisted; and
      a second attachment feature on a lower surface of the second module, wherein the second attachment feature is configured to engage with the first attachment feature when the first attachment feature is rotated about an axis of the shaft and the engagement between the first and second attachment features maintains the first attachment feature in misalignment with the second keyhole.

14. The industrial automation system of claim 13, wherein the first attachment feature comprises a groove that is substantially parallel to the axis of the shaft.

15. The industrial automation system of claim 13, wherein the second attachment feature comprises a rod-shaped protrusion formed in the lower surface of the cover of the second module.

16. The industrial automation system of claim 13, wherein the key, the first keyhole, and the second keyhole are not threaded.

17. The industrial automation system of claim 13, wherein each of the plurality of monitoring and/or control modules are independently removable by selectively disengaging the key from the second keyhole.

18. A method for connecting a programmable module to an automation controller, the method comprising:
- passing a head of a key upwardly through a first keyhole in a cover of the programmable module, wherein the head is located on a first distal end of a shaft of the key;
- abutting a mating surface of the cover of the programmable module with a mating surface of a cover of an automation controller such that the first keyhole aligns with a second keyhole in the cover of the automation controller;
- passing a first attachment feature cantilevered from a second distal end of the shaft downwardly through the second keyhole;
- axially rotating the shaft to cause the first attachment feature to become misaligned with the second keyhole and abut a lower surface of the cover of the automation controller such that disengagement of the key from the second keyhole is resisted, wherein axially rotating the shaft causes coupling between a second attachment feature on the lower surface of the cover of the automation controller such that the coupling between the first and second attachment features maintains the first attachment feature in misalignment with the second keyhole.

19. The method of claim 18, comprising mounting the connected programmable module and automation controller on a panel.

20. The method of claim 18, wherein a number and/or size of the key and corresponding first and second keyholes is configurable based upon a size of the programmable module and/or the automation controller.

* * * * *